United States Patent

Carroll

[15] 3,684,968

[45] Aug. 15, 1972

[54] FLOATING POINT AMPLIFIER

[72] Inventor: Paul E. Carroll, Houston, Tex.

[73] Assignee: Texas Instruments Incorporated, Dallas, Tex.

[22] Filed: Aug. 31, 1970

[21] Appl. No.: 68,262

[52] U.S. Cl. ....................328/142, 328/168, 330/135

[51] Int. Cl. ...............................................G06g 7/12

[58] Field of Search......328/114, 150, 185, 173, 142, 328/168; 330/130, 135; 324/123

[56] References Cited

UNITED STATES PATENTS 3,132,308 5/1964 Munson et al. .........328/175 X 3,206,689 9/1965 Santana.....................328/173

*Primary Examiner*—Donald D. Forrer
*Assistant Examiner*—B. P. Davis
*Attorney*—Harold Levine, James O. Dixon, Andrew M. Hassell, Melvin Sharp, René E. Grossman and James T. Comfort

[57] ABSTRACT

A floating point amplifier amplifies an analog signal for presentation to an analog to digital converter. The output of the floating point amplifier is sensed and the parameters of the signal are compared to cause a digital gain increase or gain decrease to the floating point amplifier.

9 Claims, 3 Drawing Figures

INVENTOR
Paul E. Carroll
BY Jim Comfort
ATTORNEY

FLOATING POINT AMPLIFIER

This invention relates to a floating point amplifier and more particularly to a gain control of a floating point amplifier.

Analog to digital converters usually require some type of amplification of signals before applying the signals to the analog to digital converters. The analog signal applied to the analog to digital converter must be within the conversion scale that the analog to digital converter can handle at the completion of the sample and hold operation. The signal rate of change which is commonly referred to as the slew rate, must be held to a value compatible to the analog to digital converter and also to the amplifier which is amplifying the analog signal before it is applied to the analog to digital converter. A floating point amplifier is a desirable type of amplifier to amplify an analog signal before applying the signal to the analog to digital converter. This is particularly true when wide signal ranges are involved. Several floating point amplifiers for analog to digital converters have been discussed previously. One proposed approach is to have a multiple fixed gain amplifier with a sample of the signal taken between amplifiers. This requires that the output of some of the amplifiers be very fast and the active signal path changes with the gain. Another approach posed has been the use of a gain memory to limit the rate of gain changed when near a zero crossing and large signals. This requires a gain memory for each channel of sample data and the gain action depends upon past history.

It is therefore an object of this invention to provide a floating point amplifier for an analog to digital converter.

It is another object to provide a floating point amplifier for an analog to digital converter having a precise gain control.

For a more complete understanding of the invention and further objects and advantages thereof, reference may now be had to the following, description taken in conjunction with the drawings, wherein.

LEVEL DETECTOR

Figure 1:
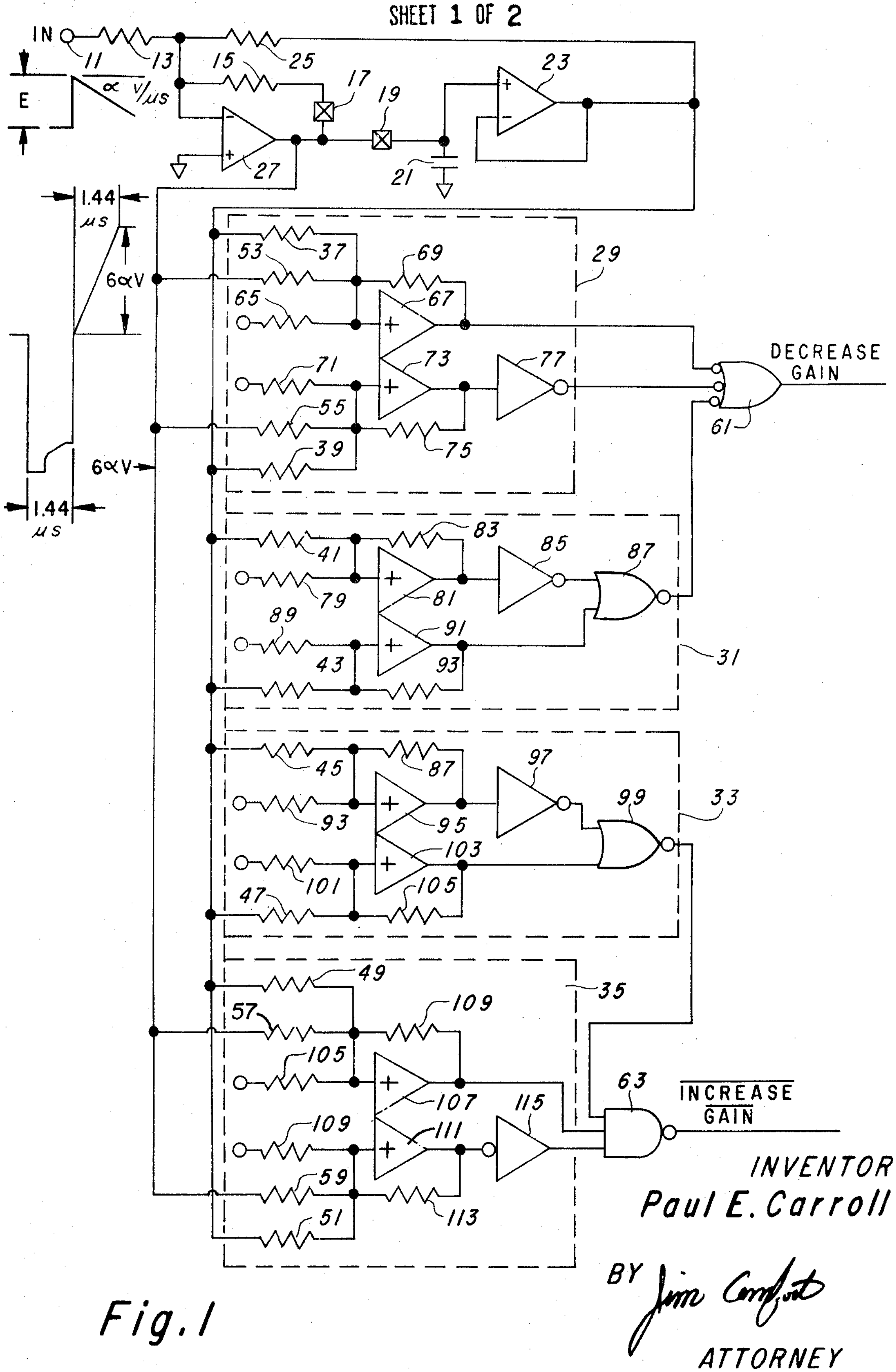
FIG. 1 shows a gain comparator.

Referring first to FIG. 1 for a description of the level detector or gain comparator, the input is applied to terminal 11, through resistor 13, amplifier 27, closed switch 19, to capacitor 21 which is connected to ground. Capacitor 21 is charged to the same value but opposite sign from the input voltage. Capacitor 21 is connected to one input of amplifier 23, the output of which is connected back through resistor 25 to the input of inverting amplifier 27. Resistor 15 and open switch 17 are connected across amplifier 27. Switches 17 and 19 are transistor switches which are turned on and off by timing controls. This circuit provides the level output at the output of amplifier 23 and the slew output at the output of amplifier 27. These signals are the inputs for the eight differential comparators 67 and 73, 81 and 91, 95 and 103, 107 and 111. All comparators are paired to perform both positive and negative comparisons.

The output of amplifier 23 is connected to resistors 37 and 39 in comparator 29, connected to resistors 41 and 43 in comparator 31, connected to resistors 45 and 47 in comparator 33, and connected to resistors 49 and 51 in comparator 35. The output of amplifier 27 is connected to resistors 53 and 55 in comparator 29 and connected to resistors 57 and 59 in comparator 35.

The outputs from comparator 29 and 31 are ored in OR circuit 61 to decrease the gain and the outputs from comparator 33 and 35 are applied to AND circuit 63 to increase the gain.

Referring first to comparator 29, resistor 65 is connected to a +12 volt source and resistors 37, 53 and 65 are connected together to a differential comparator 67. Resistor 69 is connected across differential comparator 67 and the output of differential comparator 67 is applied to one input of OR circuit 61. Resistor 71 is connected to a −12 volt source and resistors 71, 55 and 39 are connected together to differential comparator 73. Resistor 75 is connected across differential comparator 73. The output of differential comparator 73 is inverted by logic inverter 77 and applied to a second input of OR circuit 61.

The comparator 29 carries out the following comparison.

$$E+\alpha C \geqslant |3.45| V \qquad , C=7.06$$

In comparator 31 resistor 79 is connected to a +12 volt source and resistors 41 and 79 are connected to differential comparator 81. Resistor 83 is connected across differential comparator 81 and the output of differential comparator 81 is inverted by logic inverter 85 and connected to one input of OR circuit 87. Resistor 89 is connected to a −12 volt source and resistors 89 and 43 are connected to differential comparator 91. Resistor 93 is connected across differential comparator 91 and the output of differential comparator 91 is connected to a second input terminal of OR circuit 87. Comparator 31 performs the following comparison:

$$E \geqslant |5.99| V$$

In comparator 33 resistor 93 is connected to a +12 volt source and resistors 93 and 45 are connected to differential comparator 95. Resistor 87 is connected across differential comparator 95. The output of differential comparator 95 is connected through logic inverter 97 to one input of OR circuit 99. Resistor 101 is connected to a −12 volt source and resistors 101 and 47 are connected to differential comparator 103. Resistor 105 is connected across differential comparator 103 and the output of differential comparator 103 is connected to the second input of OR circuit 99. The output of OR circuit 99 is connected to one input of AND circuit 63. The comparator 33 performs the following comparison.

$$E \geqslant |1.35| V$$

In comparator 35 resistor 105 is connected to a +12 volt source and resistors 49, 57 and 105 are connected to differential comparator 107. Resistor 109 is connected across differential comparator 107 and the output of differential comparator 107 is connected to the second input of AND circuit 63. The resistor 109 is connected to a −12 volt source and resistors 109, 59 and 51 are connected to differential comparator 111.

Resistor 113 is connected across differential comparator 111 and the output of differential comparator 111 is connected through logic inverter 115 to a third input of AND circuit 63. Comparator 35 performs the following comparison.

$$E=\alpha C \geq |0.782|\, V$$

The comparator 35 causes a gain increase if the combination of the amplitude and slew are at or below the indicated level. The comparator 33 operates on level only. To cause a gain increase all four comparators' amplifiers must be below the indicated level to cause an output from AND circuit 63.

The comparator 31 is for gain decrease on level only. The comparator 29 is for gain decrease on level and rate of change. Any one of the gain decrease comparators, 67, 73, 81, or 91, can cause a decrease by the OR function shown at OR circuit 61.

OPERATION OF GAIN COMPARATOR

The input signal is applied to terminal 11 of the gain comparator. An input signal is a positive input signal is shown at the input 11 with a negative slope. At the time the signal is applied to input terminal 11 switch 17 is open and switch 19 is closed, thus the input signal is applied through amplifier 27, closed circuit 19 to charge capacitor 21 to the voltage level and opposite sign of the input signal. The signal on capacitor 21 appears at the output of amplifier 23 and is fed back to the input of inverting amplifier 27. The wave form at the output of inverting amplifier 27 is then shown at the left of amplifier 27 in the drawing. After 1.44 microseconds, switch 19 is opened and switch 17 is closed. The output of amplifier 23 is still applied to the input of amplifier 27 through resistor 25. If the input voltage to terminal 11 has not changed then the output of amplifier 27 is 0. If the input to terminal 11 has changed, the output of amplifier 27 is the difference between the input signal which has been stored on capacitor 21 minus the input at the present moment times a gain of 4.22. That signal is applied to the comparators along with the level signal stored on capacitor 21. The wave form at the output of amplifier 27 is shown to the left of the amplifier 27. When switch 19 is opened and switch 17 closed, the output of amplifier 27 drops to 0 since the input signal applied to input terminal 11 and the voltage stored on capacitor 21 are still applied to amplifier 27. The gain of amplifier 27 is now −4.22 since 15 is 4.22 × 13. Therefore the output of amplifier 27 starts to change at $-4.22\ \alpha\ V/\mu s$. After another 1.44 microseconds, the output is changed according to $4.22\ \alpha \times 1.44\ \mu S = 6\ \alpha$ volts. The decision to change the gain is made at this time as will be described further according to the outputs of the comparators and the cycle again repeats.

The comparators cause no change, a decrease gain or an increase gain during the time interval which is determined by the timing circuit. The comparison at comparator 29 determines that the voltage plus the slew rate times a constant does not exceed |3.45| volts. If the voltage plus the slew rate times a constant does exceed |3.45| volts the gain is decreased.

The comparison at comparator 31 determines that when amplitude exceeds |5.99| volts the gain is decreased.

The comparison at differential comparators 81 and 91 compares the level at the positive and a minus voltages to see if the level exceeds |5.99| volts. If it does, the gain is decreased.

The comparison in comparator 33 at differential comparators 95 and 103 looks at the minimum amplitude and provides one of the conditions for gain increase if the amplitude is below |1.35| volts.

The comparison at comparator 35 in differential comparators 107 and 111 looks to see when the absolute amplitude plus the slew rate times a constant is less than |0.782| volts. If both of these conditions are not, then the gain is increased.

Figure 2:
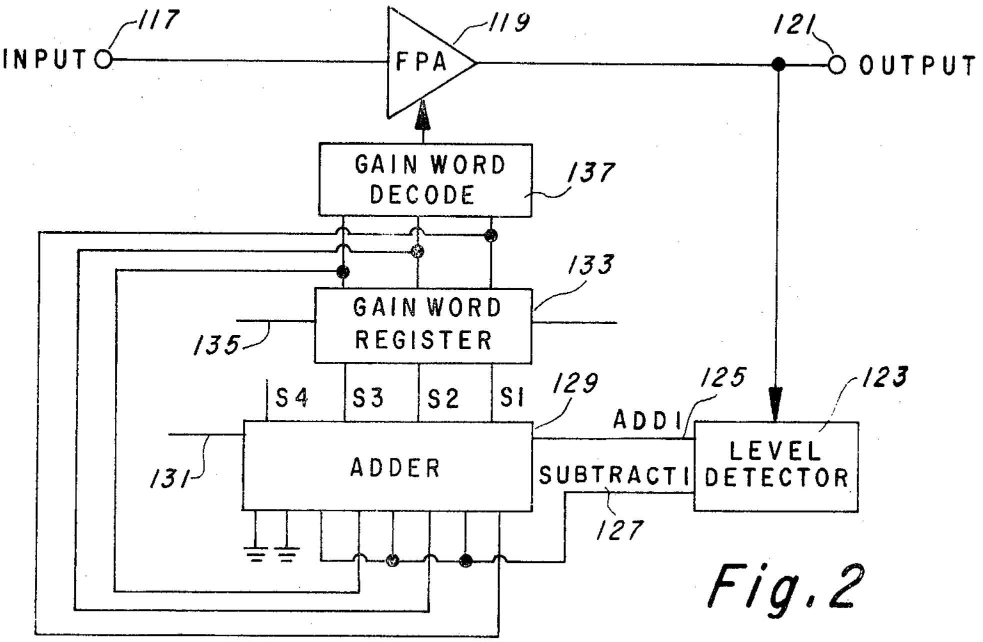
FIG. 2 shows a block diagram of the floating point amplifier.

Referring now to FIG. 2 the input to the system is applied on input terminal 117 to a floating point amplifier 119. The output from the floating point amplifier is applied to output terminal 121. The output from the floating point amplifier 119 is applied to the level detector or gain comparator 123 which is shown in more detail in FIG. 1. The level detector 123 applies an output on an add 1 output terminal 125 which is an increase gain output and applies a subtract 1 output on output terminal 127 to adder 129. The subtract 1 output is the decrease gain output from the level detector 123. Adder 129 is a four bit full adder which adds or subtracts numbers from zero to seven (the fourth bit is not used). The gain word register 133 is a register with a clock input terminal 135 which stores the results of adder 129. The contents of the gain word register 133 are decoded by the gain decoder 137 and applied to the floating point amplifier 119. The register 133 contents is also one of the adder 129 inputs.

The adder 129, the gain word register 133 and the gain word decoder 137 are components which in and of themselves are well known in the art. The floating point amplifier 119 is multiple electronically switched attenuators followed by stabilized amplifiers, which is disclosed in more detail in copending patent application TI–4254 filed concurrently with this application.

In the system shown in FIG. 2, the contents of the adder circuit 129 are clocked into the gain word register 133 and decoded by the gain word decoder 137 to either increase or decrease the gain on floating point amplifier 119.

In operation the input signal applied to terminal 117 is amplified by the floating point amplifier 119 and sensed by the level detector or gain comparator 123. The level detector 123 makes no change, adds one or subtracts one from the adder circuit 129 to make no change increase or decrease the gain of floating point amplifier 119. The operation starts by resetting the gain word register 133 to 0. Depending upon the result of the comparison in the level detector 123, either an add 1 signal is applied to cause an increase gain or a subtract 1 signal is applied to decrease the gain or there is no change so that the gain is maintained at the same level. The amplifier is logically inhibited from gain decrease at minimum gain or gain increase at maximum gain.

If the level plus the rate times a constant is less than |0.78| volts and the level is less than |1.35| volts, then the gain is increased with an add 1 signal as applied to the adder 129. If the level plus the rate times a constant is greater than |3.5| volts or the level is greater than |5.99| volts, then the gain is decreased with a subtract 1 signal. If the level plus the rate times a constant is less than or equal to | 5.99 | volts and level is less than or equal to | 3.5 | volts and the level plus the rate times a constant is greater than or equal to | 0.78 | volts or level is greater than or equal to | 1.35 | volts then there is no change in the output from the level detector 123. Thus there is no gain change in floating point amplifier 119.

Figure 3:
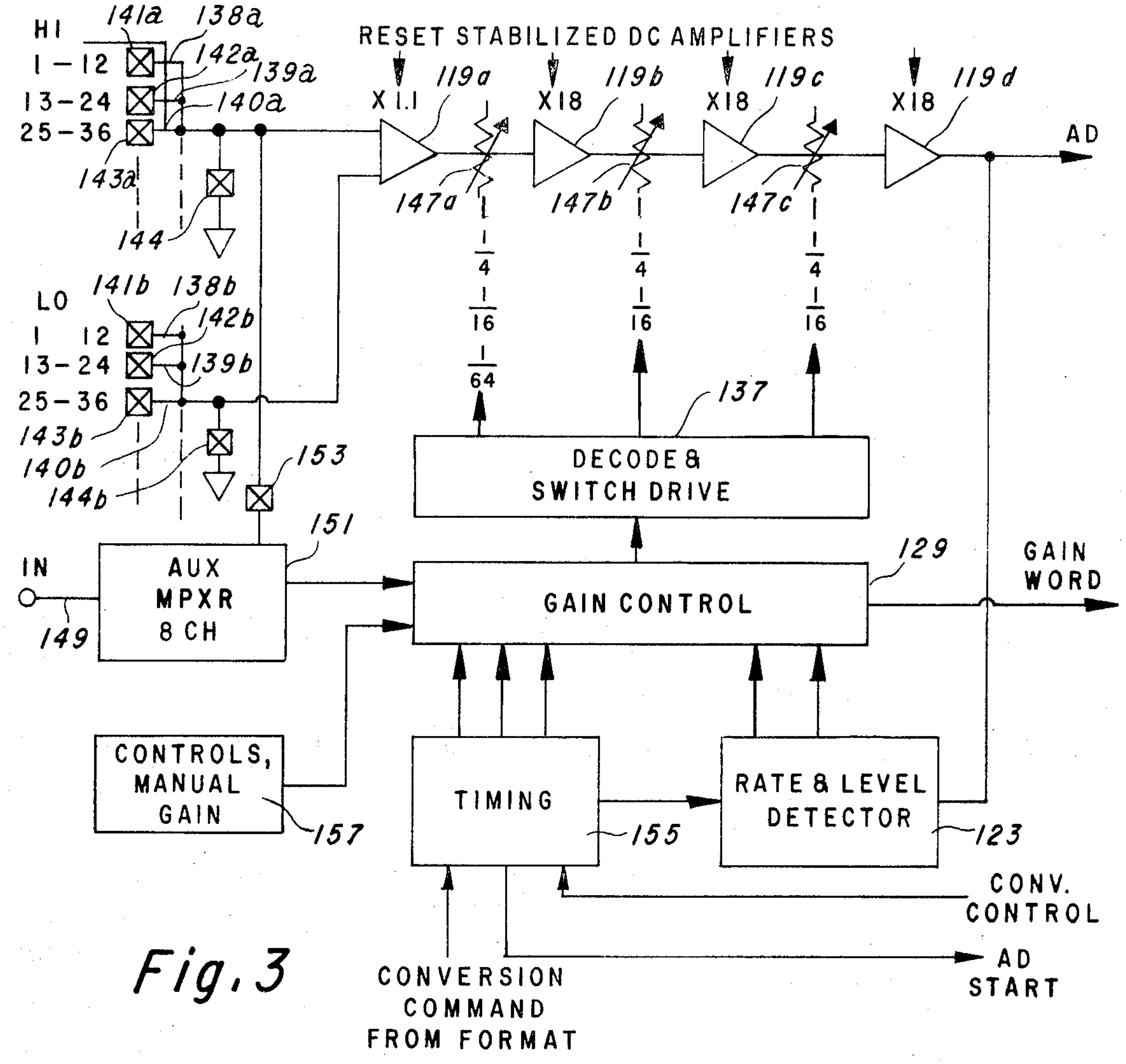
FIG. 3 shows a more detailed diagram of the floating point amplifier.

Referring now to FIG. 3 for a more detailed diagram of the system, the input signal is applied through up to 240 input multiplex channels. The multiplex inputs are applied on twisted pairs shown as a high side **138*a* through 140*a* and a low side 138*b* through 140*b*. The high side carries the signal while the low side is tied to ground at the source. Semiconductor switches 141*a* through 143*a* and 141*b* and 143*b* are interposed between the input and the amplifiers. A switch between the inputs and ground is provided on each high and low input to enable the multiplex input to be reset. The multiplex inputs are applied to a plurality of cascaded floating point amplifiers 119*a* through 119*d* with electronically controlled precision attentuators 147*a* through 147*c* interposed between the amplifiers 119*a* through 119*d*. Attentuator 147 can be set to ×1, × 1/4, ×1/16 or ×1/64, 147*b* can be set to ×1, ×1/4, or ×1/16 and attentuator 147*c* can be set to ×1, ×1/4 or ×1/16. The auxiliary channels are applied to terminal 149 through the auxiliary multiplexer 151, a switch 153, to the reset stabilized amplifiers. A control signal may also be applied from the auxiliary multiplexer input 151 to the gain control counter and register 129. The rate and level detector 123 is the same as the level detector 123 shown in FIG. 2 and the gain comparator described in FIG. 1. The timing circuit 155 applies timing control signals to the gain control counter 129 and the level detector 123 in the manner described previously. The gain control circuit 129 contains the adder 129 shown in FIG. 2 and also the gain word register 133. The decode and switch drive circuit 137 decodes the contents of the gain word register to drive electronically controlled attentuators 147*a* through 147*c* to adjust the attentuation between the reset stabilize dc amplifiers 119*a* through 119*d*. The controls, manual gain, final gain circuit 157 enables one to inhibit the gain comparator 123 and go right to manual gain control. When an auxiliary channel is addressed in auxiliary channel multiplexer 151, manual gain is automatically put into the gain control 129** at the first gain charge time and the gain comparator is ignored.

The operation of FIG. 3 is as follows. The input signals on the high-low multiplex inputs **138*a* and *b* through 140*a* and *b* are applied to the reset stabilized dc amplifiers 119*a* through 119*d*. At the beginning of the cycle the adjustable precision resistors 147*a* through 147*c* are set at a minimum gain position by the fact that the decode and switch drive 137 is reset to 0. The output from the reset stabilized dc amplifiers 119*a* through 119*d* is sensed by the rate and level detector 123 in a manner described more fully in relation to FIG. 1. This results in no change, add 1 or subtract 1 applied to the gain control 129. The contents of the gain control circuit 129 are decoded by the decode switch drive 137 to adjust the precision resistors 147*a* through 147*c*** to either increase or decrease the gain of the reset stabilized dc amplifiers in the manner described. This process is repeated six additional times for a total of seven possible changes. The initial minimum gain puts the seven changes yields the eight possible gains used. Other numbers of steps are easily possible.

What is claimed is:

1. A floating point amplifier for amplifying an analog signal for presentation to an analog to digital converter comprising:

a. means for amplifying a signal,
b. means for measuring the slew rate of change and the amplitude of the signal amplified by said amplifying means and,
c. means responsive to a predetermined slew rate of change and a predetermined amplitude of the signal means for modifying the gain of said amplifying means.

2. A floating point amplifier for amplifying an analog signal to be applied to an analog to digital converter comprising:

a. means for amplifying the input signal,
b. means for sensing the slew rate and magnitude of the signal amplified by said amplifying means,
c. means responsive to said sensing means for indicating a decrease gain, increase gain, or no change in gain,
d. adder means responsive to said indicating means for accumulating the desired gain in said floating point amplifier,
e. decoding means for decoding the contents of said adder and,
f. electronically controlled attentuators responsive to said decoding means for adjusting the attentuation of said amplifier means to adjust the overall gain of the amplifier.

3. The invention as claimed in claim 1 wherein means are provided for measuring the level of the signal amplified by said amplifying means at a first predetermined time and means for measuring the slew rate of change at a second predetermined time.

4. The invention claimed in claim 1 wherein the amplitude measured is a maximum amplitude.

5. The invention claimed in claim 1 wherein the amplitude of the signal measured is a minimum amplitude.

6. The invention claimed in claim 1 wherein the measurement of the slew rate of change and the amplitude of the signal is a comparison of the amplitude plus the slew rate times a constant compared with an absolute predetermined voltage.

7. In a floating point amplifier for amplifying an analog signal for presentation to an analog to digital converter, the combination comprising:

a. first amplifier means for providing an indication of the signal level of an incoming analog signal;
b. second amplifier means for providing an indication of the rate of change in signal level of said incoming analog signal;
c. first comparator means for comparing a multiple of the sum of said signal level and said rate of change in signal level to a first constant;
d. second comparator means for comparing said signal level to a second constant;
e. first logic means responsive to the outputs of said first and second comparator means for providing a decrease gain signal;

f. third comparator means for comparing a multiple of the sum of said signal level and said rate of change in signal level to a third constant;

g. fourth comparator means for comparing said signal level to a fourth constant; and h. second logic means responsive to the outputs of said third and fourth comparator means for providing an increase gain signal.

8. The combination of claim 7 wherein said first logic means is an OR gate.

9. The combination of claim 7 wherein said second logic means is an AND gate.

* * * * *